United States Patent
Bell (10) Patent No.: US 10,727,564 B2
(45) Date of Patent: Jul. 28, 2020

(54) CHANGEABLE EXTERNAL METER ANTENNA FOR METER ASSEMBLIES

(71) Applicant: Landis+Gyr Innovations, Inc., Alpharetta, GA (US)

(72) Inventor: Veronica V. Bell, Marietta, GA (US)

(73) Assignee: Landis+Gyr Innovations, Inc., Alpharetta, GA (US)

(*) Notice: Subject to any disclaimer, the term of this patent is extended or adjusted under 35 U.S.C. 154(b) by 341 days.

(21) Appl. No.: 15/951,857

(22) Filed: Apr. 12, 2018

(65) Prior Publication Data
US 2019/0319336 A1     Oct. 17, 2019

(51) Int. Cl.
| | |
|---|---|
| *H01Q 1/22* | (2006.01) |
| *H01Q 1/12* | (2006.01) |
| *G01R 22/06* | (2006.01) |
| *G01D 4/00* | (2006.01) |

(52) U.S. Cl.
CPC .......... *H01Q 1/2233* (2013.01); *G01D 4/004* (2013.01); *G01D 4/006* (2013.01); *G01R 22/061* (2013.01); *G01R 22/063* (2013.01); *H01Q 1/1264* (2013.01)

(58) Field of Classification Search
CPC .. H01Q 1/2233; G01B 22/061; G01B 22/063; G01D 4/004; G01D 4/006
See application file for complete search history.

(56) References Cited

U.S. PATENT DOCUMENTS

| | | | | |
|---|---|---|---|---|
| 6,115,677 A | * | 9/2000 | Perthold | G08C 17/02 702/62 |
| 6,369,769 B1 | * | 4/2002 | Nap | G01F 15/063 343/719 |
| 2003/0085844 A1 | * | 5/2003 | Olson | H01Q 1/2233 343/749 |
| 2010/0253538 A1 | * | 10/2010 | Smith | H01Q 1/2233 340/870.02 |
| 2015/0249288 A1 | * | 9/2015 | Orsi | H01Q 7/00 343/867 |
| 2016/0204501 A1 | * | 7/2016 | Bringuier | H01Q 7/00 343/702 |
| 2017/0162930 A1 | * | 6/2017 | Christiansen | H01Q 7/00 |
| 2017/0358856 A1 | * | 12/2017 | Elmerick | H01Q 21/28 |

FOREIGN PATENT DOCUMENTS

DE     102007008469 A1 *   8/2008   ........... H04B 5/0075

* cited by examiner

*Primary Examiner* — Ab Salam Alkassim, Jr.
(74) *Attorney, Agent, or Firm* — Kilpatrick Townsend & Stockton LLP (57) ABSTRACT

A meter assembly includes an meter, a meter collar, and a modular antenna assembly. The meter includes a meter antenna housed within the meter. The meter collar is coupled to the meter and includes a collar connector electrically coupled to the meter antenna through a coaxial cable. The modular antenna assembly includes a modular antenna and a modular antenna connector. In some cases, the modular antenna assembly is detachably mounted to the meter collar, and the modular antenna connector is configured to detachably connect with the collar connector such that the modular antenna is electrically coupled with the meter antenna. In various examples, a gain of the modular antenna is higher than a gain of the meter antenna.

20 Claims, 5 Drawing Sheets

CHANGEABLE EXTERNAL METER ANTENNA FOR METER ASSEMBLIES

FIELD OF THE INVENTION

This application relates to meters, and in some cases to field-changeable external antennae for meters.

BACKGROUND

Meter assemblies measure an amount of a resource (e.g., electricity, gas, etc.) consumed by a customer. Meter assemblies may be utilized in urban, suburban, and rural areas, and are often installed in residential settings, although they may be found in commercial or other settings as well. Meter assemblies commonly include a meter that is completely enclosed by a meter cover. Among other components included with the meter (e.g., processing boards, power sources, etc.), the meter typically includes an antenna that is retained inside the meter and within the meter cover. Through the antenna, the meter can communicate with other nodes in a communication network to convey and receive various information. Due to design and positioning within the meter, such antennae have limited or minimal gain for communicating with other nodes and the ability to develop a robust antenna within the meter is limited due to size restrictions within the meter. In urban and suburban areas, infrastructure exists to overcome such limitations (i.e., there are typically a number of nodes within a close proximity such that gain of the antenna is not an issue). However, in rural settings wherein fewer nodes exist, the limited communication capabilities of the antennae adversely affect the capabilities and effectiveness of the meters.

SUMMARY

The terms "invention," "the invention," "this invention" and "the present invention" used in this patent are intended to refer broadly to all of the subject matter of this patent and the patent claims below. Statements containing these terms should be understood not to limit the subject matter described herein or to limit the meaning or scope of the patent claims below. Embodiments of the invention covered by this patent are defined by the claims below, not this summary. This summary is a high-level overview of various embodiments of the invention and introduces some of the concepts that are further described in the Detailed Description section below. This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

According to some examples, a meter assembly includes a meter, a meter collar, and an antenna assembly. The meter includes a meter antenna housed within the electricity meter. The meter collar is coupled to the meter and further includes a collar connector that is electrically coupled to the meter antenna through a coaxial cable. The modular antenna assembly includes a modular antenna and a modular antenna connector. In some aspects, the modular antenna assembly is detachably mounted to the meter collar. In various examples, the modular antenna connector is configured to detachably connect with the collar connector such that the modular antenna is electrically coupled with the meter antenna. In some cases, a gain of the modular antenna, or how much power is transmitted in the specified direction of radiation (e.g., a direction of peak radiation), is higher than a gain of the meter antenna.

In various cases, the modular antenna is a directional antenna that is adjustable relative to the meter antenna. In certain examples, the modular antenna assembly further includes an adjustable dial that is physically connected to the modular antenna such that positioning of the adjustable dial adjusts a direction that the modular antenna is directed. In some aspects, the adjustable dial further includes a dial lock configured to selectively secure the adjustable dial in a position relative to the modular antenna assembly. In various examples, the dial lock is a tamper resistant dial lock. In certain cases, the adjustable dial further includes a position indicator configured to indicate that direction that the modular antenna is directed.

In some aspects, the modular antenna assembly is at a position vertically offset from the meter antenna such that the modular antenna is vertically offset from the meter. In various examples, the position of the modular antenna assembly is above the meter such that the modular antenna is above the meter. In certain examples, the meter collar is configured to connect to a meter socket and is configured to form a single connection of the meter assembly between the meter socket and the meter assembly. According to various aspects, the modular antenna is an omnidirectional antenna. In some examples, the collar connector includes a radio frequency (RF) connector.

According to certain examples, a meter assembly includes a meter having a meter antenna housed within the meter. The meter assembly also includes a meter collar coupled to the meter and including a collar connector electrically coupled to the meter antenna through a coaxial cable. In certain examples, the meter assembly includes a modular antenna assembly including a modular antenna and a modular antenna connector. In various cases, the modular antenna assembly is coupled to the meter collar. In some examples, the modular antenna connector is configured to detachably connect with the collar connector such that the modular antenna is electrically coupled with the meter antenna. In various aspects, the modular antenna is a directional antenna that is adjustable relative to the meter antenna.

In some cases, the modular antenna assembly further includes an adjustable dial that is physically connected to the modular antenna such that positioning of the adjustable dial adjusts a direction that the modular antenna is directed. In various examples, the adjustable dial further includes a position indicator configured to indicate that direction that the modular antenna is directed. According to certain aspects, the modular antenna assembly is at a position vertically offset from the meter antenna such that the modular antenna is vertically offset from the meter. In certain cases, the position of the modular antenna assembly is above the meter such that the modular antenna is above the meter. In various examples, the meter collar is configured to connect to a meter socket. In some aspects, the meter collar is configured to form a single connection of the meter assembly between the meter socket and the meter assembly. In certain cases, the collar connector comprises an RF connector.

According to certain examples, a meter assembly includes a meter, a meter collar, and a modular antenna assembly. The meter includes a meter antenna housed within the meter. The meter collar is coupled to the meter and further includes a collar connector that is electrically coupled to the meter antenna through a coaxial cable. The modular antenna assembly includes a modular antenna, an adjustable dial, and a modular antenna connector. In some examples, the modular antenna connector is configured to detachably connect with the collar connector. In various cases, the modular antenna is a directional antenna that is adjustable relative to the meter antenna. In some cases, the dial is physically connected to the modular antenna such that positioning of the adjustable dial adjusts a direction that the modular antenna is directed.

In some aspects, the modular antenna assembly is coupled to the meter collar. In various examples, the adjustable dial further includes a position indicator configured to indicate that direction that the modular antenna is directed and a dial lock configured to selectively secure the adjustable dial in a position relative to the modular antenna assembly. In certain aspects, the modular antenna assembly is at a position vertically offset from the meter antenna such that the modular antenna is vertically offset from the meter. In certain cases, the position of the modular antenna assembly is above the meter such that the modular antenna is above the meter. In various cases, the collar connector comprises an RF connector.

Various implementations described in the present disclosure can include additional systems, methods, features, and advantages, which cannot necessarily be expressly disclosed herein but will be apparent to one of ordinary skill in the art upon examination of the following detailed description and accompanying drawings. It is intended that all such systems, methods, features, and advantages be included within the present disclosure and protected by the accompanying claims.

BRIEF DESCRIPTION OF THE DRAWINGS

The features and components of the following figures are illustrated to emphasize the general principles of the present disclosure. Corresponding features and components throughout the figures can be designated by matching reference characters for the sake of consistency and clarity.

DETAILED DESCRIPTION

The subject matter of embodiments of the present invention is described here with specificity to meet statutory requirements, but this description is not necessarily intended to limit the scope of the claims. The claimed subject matter may be embodied in other ways, may include different elements or steps, and may be used in conjunction with other existing or future technologies. This description should not be interpreted as implying any particular order or arrangement among or between various steps or elements except when the order of individual steps or arrangement of elements is explicitly described.

In one aspect, disclosed is a modular antenna assembly, which includes a modular antenna, for a meter such as an electricity meter or other meter, which includes a meter antenna. Generally, the meter antenna is retained within the meter and is not easily accessible to service, update, and/or change without disrupting functioning of the meter. The modular antenna is supplemental to the meter antenna and has improved gain (i.e., how much power is transmitted in the specified direction of radiation, such as a direction of peak radiation) and/or directivity compared to the meter antenna to improve connectivity of the meter to other nodes (e.g., meters or other suitable nodes in a network). The modular antenna assembly is detachably coupled to the meter such that the modular antenna assembly can be changed in the field (e.g., to change type of modular antenna) without having to uninstall the entire meter or disrupt functioning of the meter. In other words, the modular antenna assembly is "field-removable" such that the meter, and particularly the modular antenna, can be upgraded or serviced wherever it is situated rather than having to uninstall the meter (and disrupt functioning of the meter) and/or take the meter to another location to be upgraded.

In some examples, the modular antenna assembly is detachably coupled to a meter collar that supports the meter on a meter box. In certain examples, the meter collar may extend the meter out from the meter box and includes a connection from the antenna port of the meter. In various examples, the meter and meter collar may be deployed without the modular antenna assembly, and the modular antenna assembly having the desired type of modular antenna may be later added on as needed or desired. In some examples, the meter and meter collar may be initially deployed with a modular antenna assembly having a modular antenna that may be similar to the meter antenna and have a minimal gain. In other examples, the meter and meter collar may be deployed with a modular antenna assembly having a modular antenna that has a higher gain and/or improved directivity compared to the meter antenna, or the initial modular antenna assembly may be swapped for a subsequent modular antenna assembly as desired. In certain cases, the modular antenna of the modular antenna assembly may point in different directions compared to the meter antenna. In various examples, the direction of the modular antenna may be adjusted by swapping modular antenna assemblies having modular antennae that radiate in different directions based on the equipment need in the field. In other examples, the direction of the modular antenna may be adjusted through a dial or other antenna adjuster of the modular antenna assembly. Through the modular antenna assembly, a field operator can utilize different antennae and optimize the modular antenna as needed in the field, which reduces the need for routers, particularly in more rural areas.

Figure 1:
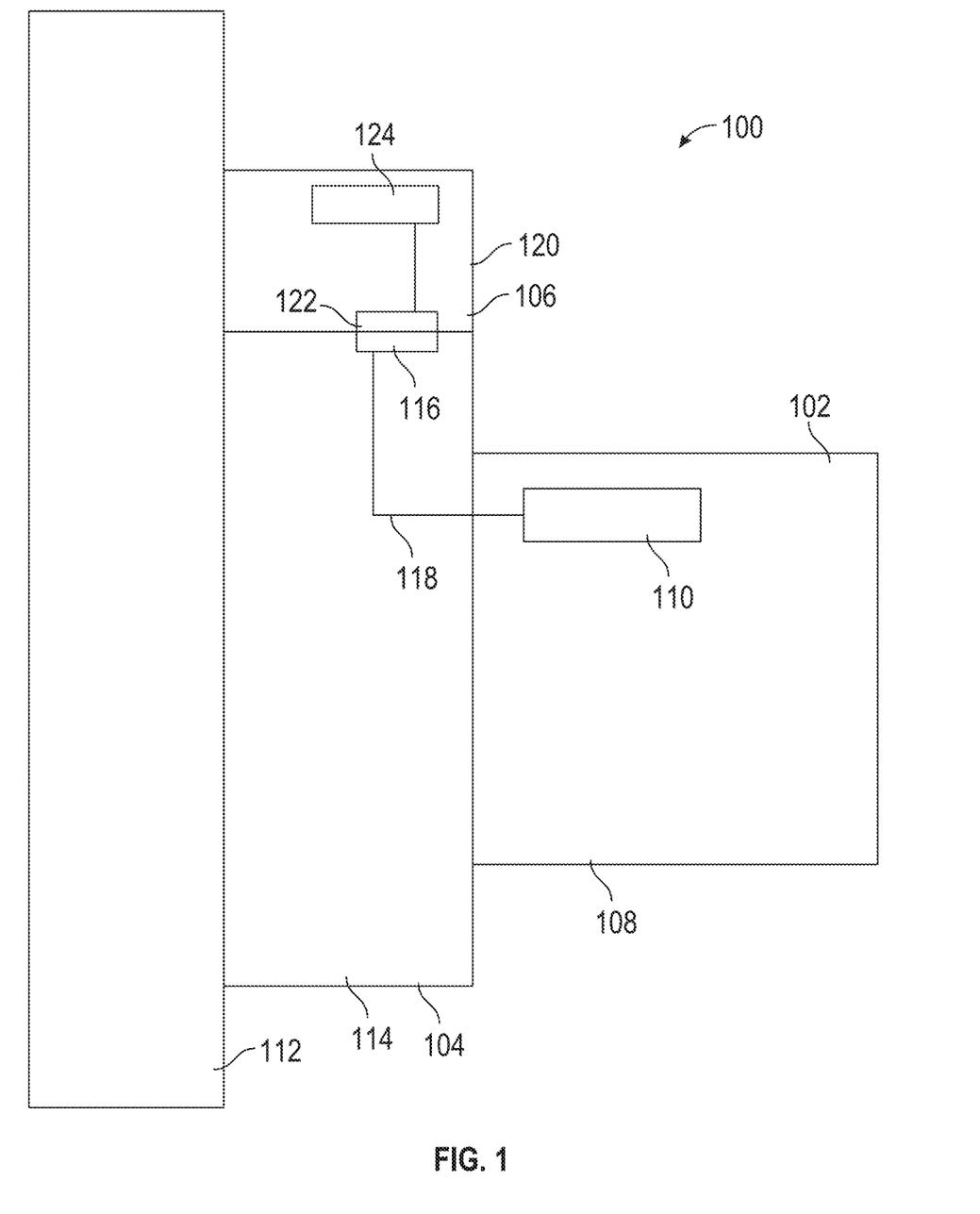
FIG. 1 is a schematic of a meter assembly including a meter, a meter collar, and a modular antenna according to aspects of the current disclosure.

FIG. 1 is a schematic of an example of a meter assembly 100 according to aspects of the present disclosure. As illustrated in FIG. 1, the meter assembly 100 includes a meter 102, a meter collar 104, and a modular antenna assembly 106. The meter 102 includes a meter housing 108 that houses at least one meter antenna 110 among various other electrical components including, but not limited to a power supply module, a processing module, a base metrology module, a communication module, and/or a modular modem, among others. In certain examples, the meter 102 also includes a meter cover 202 (see, e.g., FIGS. 2 and 3) that covers the meter housing 102. When included, the meter cover may be constructed from various materials including, but not limited to, glass, plastics, metal, or various other suitable materials for a meter cover. In certain non-limiting examples, the meter 102 is an American National Standards Institute (ANSI) meter, meaning that the meter 102 meets the standards provided by the American National Standard Institute for meters, including that the meter 102 has a round profile and is designed to mount into a socket (e.g., through blades).

In various examples, the meter 102 is coupled to the meter collar 104. The meter collar 104 is installed between the meter 102 and a meter box 112 that the meter 102 would otherwise plug into at the site of the meter assembly 100. The meter collar 104 includes a collar housing 114 that includes connectors for connecting with connectors of the meter box 112 and connectors for connecting with the meter 102. As one non-limiting example, the meter collar 104 may plug into a socket of the meter box 112, and the meter 102 in turn may plug into the meter collar 104. In various aspects, the meter collar 104 is utilized to extend the meter 102 out from the meter box 112. In certain examples, the meter collar 104 acts as an adapter between the meter box 112 and the meter 102 such that a specific meter is not required for the meter assembly 100. In certain aspects, spacing the meter away from the meter box 112 through the collar 104 may improve performance of the antenna. In various examples, a coaxial cable 118 is housed in the meter collar 104. The coaxial cable 118 connects to the antenna 110 (e.g., the antenna port) of the meter 102 to a collar connector 116. In various examples, the collar connector 116 is an RF (radio frequency) connector. In one non-limiting example, the collar connector 116 is an SMA (subminiature version A) connector, although various other types of RF connectors may be utilized as desired.

As illustrated in FIG. 1, in some examples, the modular antenna assembly 106 is detachably mounted on the meter collar 104. In some examples, the modular antenna assembly 106 is detachably mounted on the meter collar 104 through a snap-fit connection. In such examples, a housing 120 of the modular antenna assembly 106 may include a protruding portion and the collar housing 114 may include a corresponding depression or other suitable snap-in area configured to receive the protruding portion of the housing 120, or vice versa. In other examples, various other suitable connectors or connecting systems may be utilized including, but not limited to, clips, hooks, pins, nuts and bolts, clasps, or various other suitable connectors such that the modular antenna assembly 106 can be changed and/or removed from the meter assembly 100 in the field without having to uninstall the entire meter or disrupt functioning of the meter 102.

Figure 7:
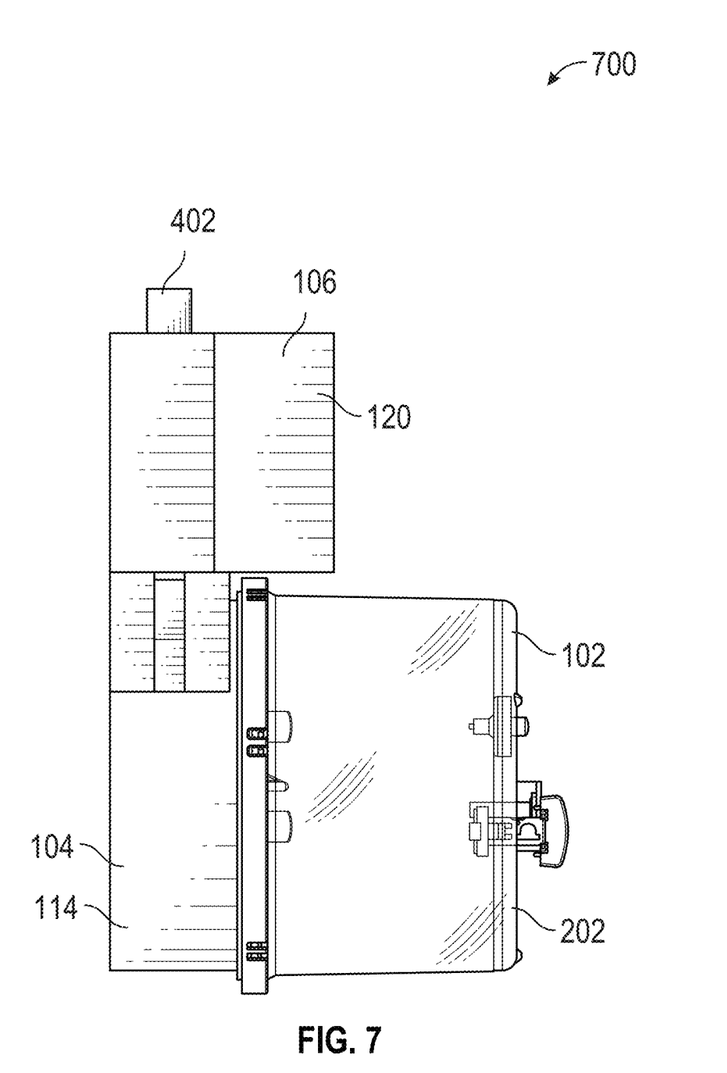
FIG. 7 is a perspective view of a meter assembly according to aspects of the current disclosure.

In certain examples, as illustrated in FIG. 7, the modular antenna assembly 106 may extend at least partially over the meter 102. In other examples, it need not extend over the meter 102 and/or away from the meter collar 104 over the meter 102. In various aspects, various antennae 124 (discussed below) may be utilized with the modular antenna assembly 106 depending on a size or shape of the modular antenna assembly 106.

The modular antenna assembly 106 includes a modular antenna connector 122 in communication with a modular antenna 124. Similar to the collar connector 116, in various examples, the modular antenna connector 122 is an RF connector. The modular antenna connector 122 is configured to connect with the collar connector 116 such that the modular antenna 124 is communicatively coupled to the meter antenna 110 through the coaxial cable 118 and the connectors 116, 122.

In various examples, the modular antenna 124 may be various types of antennae that supplement and improve the radiation from the meter 102. In some examples, the modular antenna 124 is a "standard" antenna that is similar in gain to the meter antenna 110. In certain cases, the modular antenna 124 is an omnidirectional antenna. In further examples, the modular antenna 124 is a directional antenna. In certain examples with direction antennae (or other suitable antennae), the direction of the antenna 124 may be adjusted such that the antenna 124 is facing a desired direction. Various other types of antennae may be provided with the modular antenna assembly 106 as desired and/or needed in the field. In certain examples, a modular antenna assembly 106 having a specific type of modular antenna 124 (e.g., a particular direction, gain, etc.) may be selected and installed with the meter assembly 100 as needed in the field. In various examples, the modular antenna assembly 106 is vertically offset from the meter 102. In some non-limiting examples, the modular antenna assembly 106 is at a position that is vertically above the meter 102 to improve connectivity of the modular antenna 124.

Figure 2:
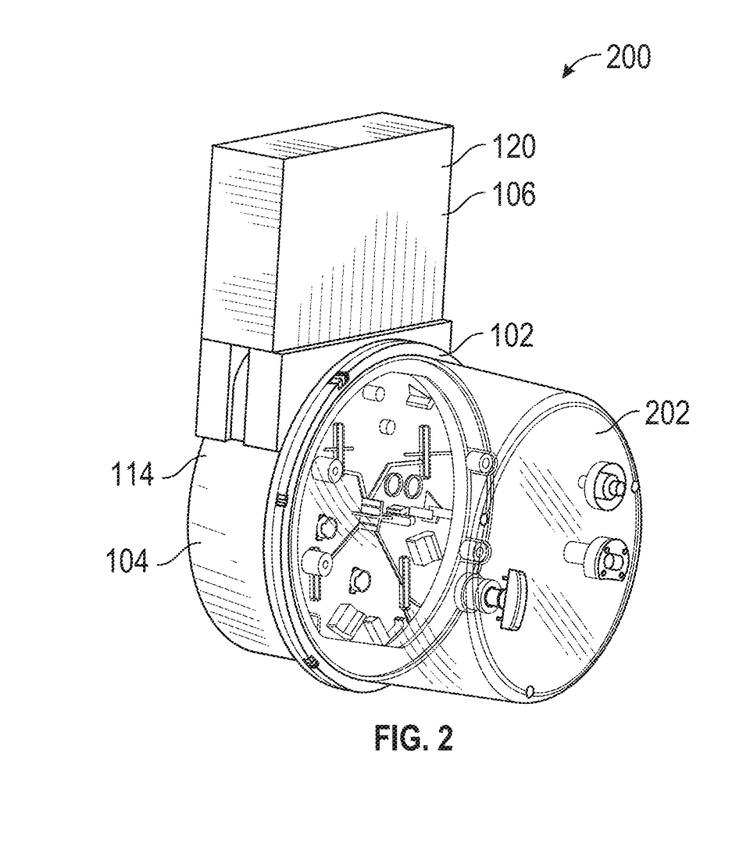
FIG. 2 is a perspective view of a meter assembly including a meter, a meter collar, and a modular antenna according to aspects of the current disclosure.
Figure 3:
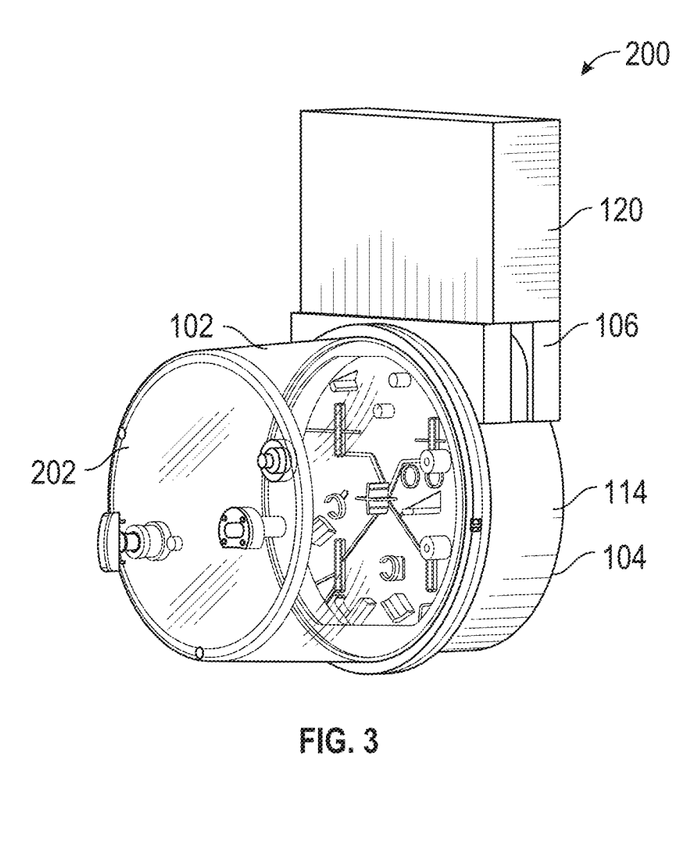
FIG. 3 is another perspective view of the meter assembly of FIG. 2.

FIGS. 2 and 3 illustrate an example of a meter assembly 200 that is substantially similar to the meter assembly 100 schematically shown in FIG. 1. As illustrated in FIGS. 2 and 3, the meter assembly 200 includes the meter 102, the meter collar 104, and the modular antenna assembly 106. In various examples, the meter 102 includes a meter cover 202 that encloses the meter 102. As previously described, the meter cover may be constructed from various materials suitable for covering and protecting the meter 102.

Figure 4:
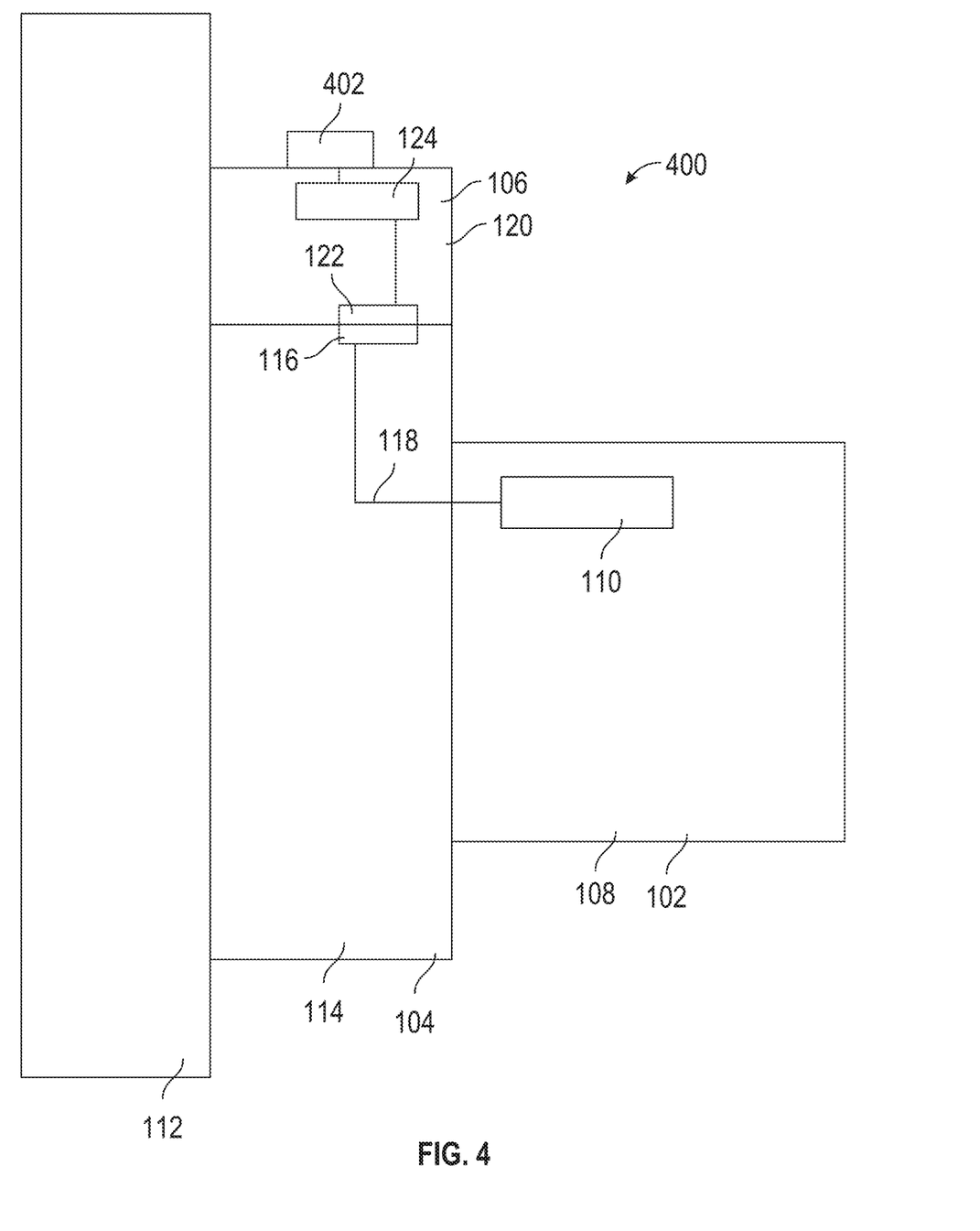
FIG. 4 is a schematic of a meter assembly including a meter, a meter collar, and a modular antenna according to aspects of the current disclosure.

FIG. 4 is a schematic of an example of a meter assembly 400 that is substantially similar to the meter assembly 100 except that the modular antenna assembly 106 further includes an adjustable dial 402. In various examples, the adjustable dial 402 is physically connected to the modular antenna 124 (e.g., a directional antenna) and is movable relative to the housing 120 of the modular antenna assembly 106. In various examples, positioning (e.g., rotation or other suitable positioning) of the adjustable dial 402 adjusts a direction that the modular antenna 124 is facing and radiates. In other words, through the adjustable dial 402, the modular antenna 124 is physically moved and the direction in which that the antenna 124 is pointed changes. In some examples, the adjustable dial 402 allows for minute adjustments to the modular antenna 124 to optimize the positioning and effectiveness of the modular antenna 124 as desired.

In certain cases, the adjustable dial 402 includes a position indicator that indicates the direction that the modular antenna 124 is facing. In various examples, the position indicator may be an angle indicator, electronic display, or various other suitable position indicators.

In various aspects, a dial lock is provided with the adjustable dial 402. In certain cases, the dial lock selectively secures the adjustable dial 402 in a desired position relative to the housing 120 (and thus the position of the modular antenna 124). In some examples, the dial lock is a tamper resistant lock that prevents movement or adjustment of the adjustable dial 402 unless the dial lock is unlocked with a field tool. In certain cases, the dial lock is a temporary lock that allows for future adjustment of the adjustable dial 402 (and thus the modular antenna 124) as desired.

Figure 5:
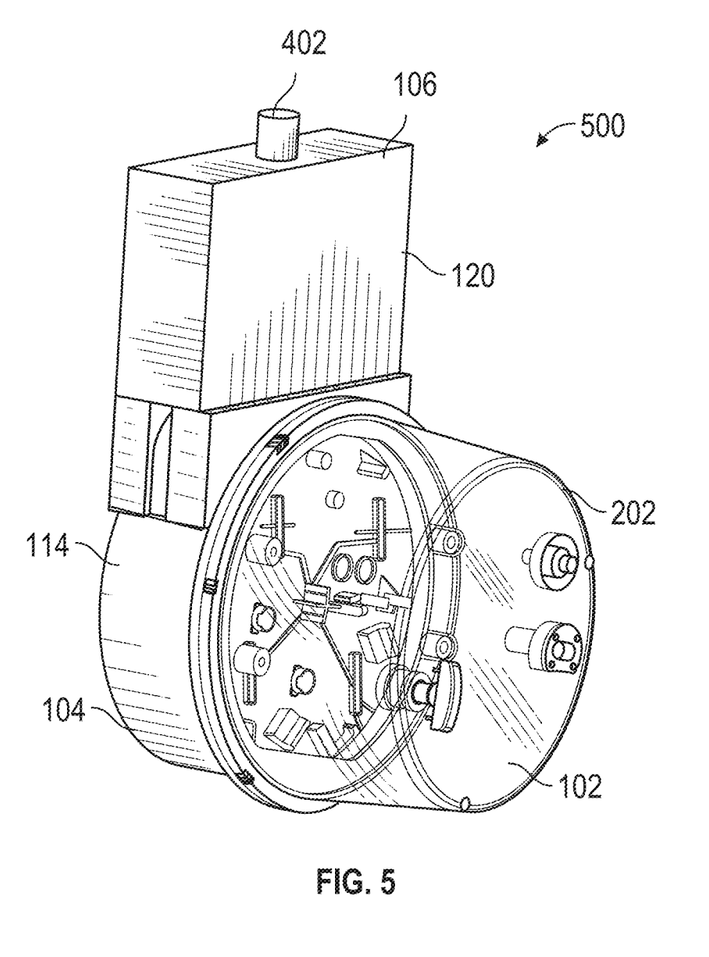
FIG. 5 is a perspective view of a meter assembly including a meter, a meter collar, and a modular antenna according to aspects of the current disclosure.
Figure 6:
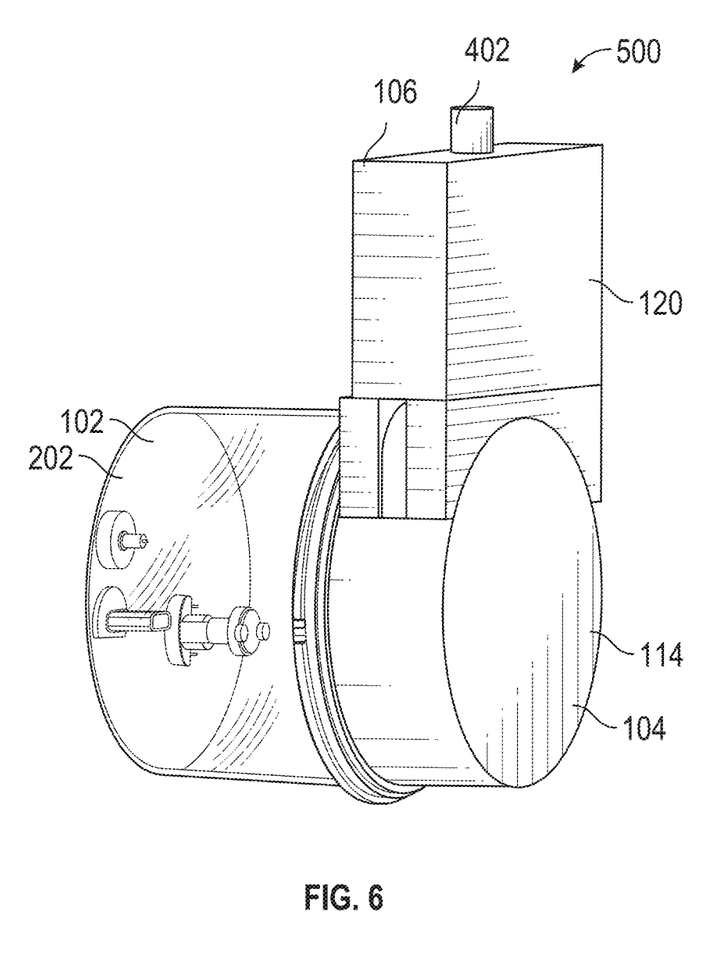
FIG. 6 is another perspective view of the meter assembly of FIG. 5.

FIGS. 5 and 6 illustrate an example of a meter assembly 500 that is substantially similar to the meter assembly 400 schematically shown in FIG. 4. Similar to the meter assembly 200, in some examples, the meter assembly 500 includes the meter cover 202.

FIG. 7 illustrates an example of a meter assembly 700 that is substantially similar to the meter assembly 500 except that the modular antenna assembly 106 extends at least partially over the meter 102. Optionally, compared to the meter assembly 500, the meter assembly 700 may utilize various different antennae (not shown in FIG. 7).

A method of assembling a meter assembly also provided. In various examples, the method includes assembling the meter 102 with the meter collar 104. In some cases, assembling the meter 102 with the meter collar 104 includes connecting the coaxial cable 118 that is housed in the meter collar 104 with the meter antenna 110 of the meter 102. In certain aspects, the method includes positioning the assembled meter 102 and meter collar 104 at a desired location. In some cases, positioning the meter 102 and meter collar 104 includes mounting the meter collar 104 on a meter box 112 located in the desired location.

In some examples, the method includes detachably positioning the modular meter assembly 106 on the meter collar 104. In some examples, the modular meter assembly 106 is attached prior to mounting the meter collar 104 on the meter box 112; however, in other examples, the modular meter assembly 106 may be detachably connected to the meter collar 104 after the meter collar 104 is mounted on the meter box 112. In certain cases, detachably connecting the modular meter assembly 106 with the meter collar 104 includes positioning the modular meter assembly 106 such that the modular antenna 124 is vertically offset from the meter 102. In various examples, detachably connecting the modular meter assembly 106 with the meter collar 106 includes connecting the modular antenna connector 122 with the collar connector 116 such that the modular antenna 124 is communicatively coupled to the meter antenna 110 through the coaxial cable 118 and the connectors 116, 122. Optionally, in some examples, the method includes adjusting a direction of the modular antenna 124. In certain examples, adjusting a direction of the modular antenna 124 includes positioning the adjustable dial 402, such as rotating the adjustable dial 402, to change the position of the modular antenna 124 until the modular antenna 124 is facing a desired direction. In various cases, the method includes changing one modular antenna assembly 106 with a different modular antenna assembly 106 having a different modular antenna 124 in the field by detaching the previous modular antenna assembly 106 from the meter collar 106 and detachably connecting the replacement modular antenna assembly 106 on the meter collar 106.

A collection of exemplary embodiments, including at least some explicitly enumerated as "ECs" (Example Combinations), providing additional description of a variety of embodiment types in accordance with the concepts described herein are provided below. These examples are not meant to be mutually exclusive, exhaustive, or restrictive; and the invention is not limited to these example embodiments but rather encompasses all possible modifications and variations within the scope of the issued claims and their equivalents.

EC 1. A meter assembly comprising: a meter comprising a meter antenna housed within the meter; a meter collar coupled to the meter and comprising a collar connector electrically coupled to the meter antenna through a coaxial cable; and a modular antenna assembly comprising a modular antenna and a modular antenna connector, wherein the modular antenna assembly is detachably mounted to the meter collar, wherein the modular antenna connector is configured to detachably connect with the collar connector such that the modular antenna is electrically coupled with the meter antenna, and wherein a gain of the modular antenna is higher than a gain of the meter antenna.

EC 2. The meter assembly of any of the preceding or subsequent example combinations, wherein the modular antenna is a directional antenna that is adjustable relative to the meter antenna.

EC 3. The meter assembly of any of the preceding or subsequent example combinations, wherein the modular antenna assembly further comprises an adjustable dial, and wherein the adjustable dial is physically connected to the modular antenna such that positioning of the adjustable dial adjusts a direction that the modular antenna is directed.

EC 4. The meter assembly of any of the preceding or subsequent example combinations, wherein the adjustable dial further comprises a dial lock configured to selectively secure the adjustable dial in a position relative to the modular antenna assembly, and wherein the dial lock is a tamper resistant dial lock.

EC 5. The meter assembly of any of the preceding or subsequent example combinations, wherein the adjustable dial further comprises a position indicator configured to indicate that direction that the modular antenna is directed.

EC 6. The meter assembly of any of the preceding or subsequent example combinations, wherein the meter further comprises a meter cover, and wherein the meter antenna is housed within the meter cover.

EC 7. The meter assembly of any of the preceding or subsequent example combinations, wherein the modular antenna assembly is at a position vertically offset from the meter antenna such that the modular antenna is vertically offset from the meter.

EC 8. The meter assembly of any of the preceding or subsequent example combinations, wherein the position of the modular antenna assembly is above the meter such that the modular antenna is above the meter.

EC 9. The meter assembly of any of the preceding or subsequent example combinations, wherein the meter collar is configured to connect to a meter socket, and wherein the meter collar is configured to form a single connection of the meter assembly between the meter socket and the meter assembly.

EC 10. The meter assembly of any of the preceding or subsequent example combinations, wherein the modular antenna is an omnidirectional antenna.

EC 11. The meter assembly of any of the preceding or subsequent example combinations, wherein the collar connector comprises an RF connector.

EC 12. A meter assembly comprising: a meter comprising a meter antenna housed within the meter; a meter collar coupled to the meter and comprising a collar connector electrically coupled to the meter antenna through a coaxial cable; and a modular antenna assembly comprising a modular antenna and a modular antenna connector, wherein the modular antenna assembly is coupled to the meter collar, wherein the modular antenna connector is configured to detachably connect with the collar connector such that the modular antenna is electrically coupled with the meter antenna, and wherein the modular antenna is a directional antenna that is adjustable relative to the meter antenna.

EC 13. The meter assembly of any of the preceding or subsequent example combinations, wherein the modular antenna assembly further comprises an adjustable dial, and wherein the adjustable dial is physically connected to the modular antenna such that positioning of the adjustable dial adjusts a direction that the modular antenna is directed.

EC 14. The meter assembly of any of the preceding or subsequent example combinations, wherein the adjustable dial further comprises a dial lock configured to selectively secure the adjustable dial in a position relative to the modular antenna assembly, and wherein the dial lock is a tamper resistant dial lock.

EC 15. The meter assembly of any of the preceding or subsequent example combinations, wherein the adjustable dial further comprises a position indicator configured to indicate that direction that the modular antenna is directed.

EC 16. The meter assembly of any of the preceding or subsequent example combinations, wherein the modular antenna assembly is at a position vertically offset from the meter antenna such that the modular antenna is vertically offset from the meter.

EC 17. The meter assembly of any of the preceding or subsequent example combinations, wherein the position of the modular antenna assembly is above the meter such that the modular antenna is above the meter.

EC 18. The meter assembly of any of the preceding or subsequent example combinations, wherein the meter collar is configured to connect to a meter socket, and wherein the meter collar is configured to form a single connection of the meter assembly between the meter socket and the meter assembly.

EC 19. The meter assembly of any of the preceding or subsequent example combinations, wherein the collar connector comprises an RF connector.

EC 20. A meter assembly comprising: a meter comprising a meter antenna housed within the meter; a meter collar coupled to the meter and comprising a collar connector electrically coupled to the meter antenna through a coaxial cable; and a modular antenna assembly comprising a modular antenna, an adjustable dial, and a modular antenna connector, wherein the modular antenna connector is configured to detachably connect with the collar connector, wherein the modular antenna is a directional antenna that is adjustable relative to the meter antenna, and wherein the dial is physically connected to the modular antenna such that positioning of the adjustable dial adjusts a direction that the modular antenna is directed.

EC 21. The meter assembly of any of the preceding or subsequent example combinations, wherein the modular antenna assembly is coupled to the meter collar.

EC 22. The meter assembly of any of the preceding or subsequent example combinations, wherein the adjustable dial further comprises a dial lock configured to selectively secure the adjustable dial in a position relative to the modular antenna assembly, and wherein the dial lock is a tamper resistant dial lock.

EC 23. The meter assembly of any of the preceding or subsequent example combinations, wherein the adjustable dial further comprises a position indicator configured to indicate that direction that the modular antenna is directed.

EC 24. The meter assembly of any of the preceding or subsequent example combinations, wherein the modular antenna assembly is at a position vertically offset from the meter antenna such that the modular antenna is vertically offset from the meter.

EC 25. The meter assembly of any of the preceding or subsequent example combinations, wherein the position of the modular antenna assembly is above the meter such that the modular antenna is above the meter.

EC 26. The meter assembly of any of the preceding or subsequent example combinations, wherein the meter collar is configured to connect to a meter socket, and wherein the meter collar is configured to form a single connection of the meter assembly between the meter socket and the meter assembly.

EC 27. The meter assembly of any of the preceding or subsequent example combinations, wherein the collar connector comprises an RF connector.

The above-described aspects are merely possible examples of implementations, merely set forth for a clear understanding of the principles of the present disclosure. Many variations and modifications can be made to the above-described embodiment(s) without departing substantially from the spirit and principles of the present disclosure. All such modifications and variations are intended to be included herein within the scope of the present disclosure, and all possible claims to individual aspects or combinations of elements or steps are intended to be supported by the present disclosure. Moreover, although specific terms are employed herein, as well as in the claims that follow, they are used only in a generic and descriptive sense, and not for the purposes of limiting the described invention, nor the claims that follow.

That which is claimed:

1. A meter assembly comprising: a meter comprising a meter antenna housed within the meter; a meter collar coupled to the meter and comprising a collar connector electrically coupled to the meter antenna through a coaxial cable; and a modular antenna assembly comprising a modular antenna and a modular antenna connector, wherein the modular antenna assembly is detachably mounted to the meter collar, wherein the modular antenna connector is configured to detachably connect with the collar connector such that the modular antenna is electrically coupled with the meter antenna, and wherein a gain of the modular antenna is higher than a gain of the meter antenna.

2. The meter assembly of claim 1, wherein the modular antenna is a directional antenna that is adjustable relative to the meter antenna.

3. The meter assembly of claim 2, wherein the modular antenna assembly further comprises an adjustable dial, and wherein the adjustable dial is physically connected to the modular antenna such that positioning of the adjustable dial adjusts a direction that the modular antenna is directed.

4. The meter assembly of claim 3, wherein the adjustable dial further comprises a dial lock configured to selectively secure the adjustable dial in a position relative to the modular antenna assembly, and wherein the dial lock is a tamper resistant dial lock.

5. The meter assembly of claim 3, wherein the adjustable dial further comprises a position indicator configured to indicate that direction that the modular antenna is directed.

6. The meter assembly of claim 1, wherein the modular antenna assembly is at a position vertically offset from the meter antenna such that the modular antenna is vertically offset from the meter.

7. The meter assembly of claim 6, wherein the position of the modular antenna assembly is above the meter such that the modular antenna is above the meter.

8. The meter assembly of claim 1, wherein the meter collar is configured to connect to a meter socket, and wherein the meter collar is configured to form a single connection of the meter assembly between the meter socket and the meter assembly.

9. The meter assembly of claim 1, wherein the modular antenna is an omnidirectional antenna.

10. The meter assembly of claim 1, wherein the collar connector comprises a radio frequency (RF) connector.

11. A meter assembly comprising:
- a meter comprising a meter antenna housed within the meter;
- a meter collar coupled to the meter and comprising a collar connector electrically coupled to the meter antenna through a coaxial cable; and
- a modular antenna assembly comprising a modular antenna and a modular antenna connector, wherein the modular antenna assembly is coupled to the meter collar, wherein the modular antenna connector is configured to detachably connect with the collar connector such that the modular antenna is electrically coupled with the meter antenna, and wherein the modular antenna is a directional antenna that is adjustable relative to the meter antenna.

12. The meter assembly of claim 11, wherein the modular antenna assembly further comprises an adjustable dial, wherein the adjustable dial is physically connected to the modular antenna such that positioning of the adjustable dial adjusts a direction that the modular antenna is directed, and wherein the adjustable dial further comprises a position indicator configured to indicate that direction that the modular antenna is directed.

13. The meter assembly of claim 11, wherein the modular antenna assembly is at a position vertically offset from the meter antenna such that the modular antenna is vertically offset from the meter, and wherein the position of the modular antenna assembly is above the meter such that the modular antenna is above the meter.

14. The meter assembly of claim 11, wherein the meter collar is configured to connect to a meter socket, and wherein the meter collar is configured to form a single connection of the meter assembly between the meter socket and the meter assembly.

15. The meter assembly of claim 11, wherein the collar connector comprises an RF connector.

16. A meter assembly comprising:
- a meter comprising a meter antenna housed within the meter;
- a meter collar coupled to the meter and comprising a collar connector electrically coupled to the meter antenna through a coaxial cable; and
- a modular antenna assembly comprising a modular antenna, an adjustable dial, and a modular antenna connector, wherein the modular antenna connector is configured to detachably connect with the collar connector, wherein the modular antenna is a directional antenna that is adjustable relative to the meter antenna, and wherein the dial is physically connected to the modular antenna such that positioning of the adjustable dial adjusts a direction that the modular antenna is directed.

17. The meter assembly of claim 16, wherein the modular antenna assembly is coupled to the meter collar.

18. The meter assembly of claim 16, wherein the adjustable dial further comprises:
- a position indicator configured to indicate that direction that the modular antenna is directed; and
- a dial lock configured to selectively secure the adjustable dial in a position relative to the modular antenna assembly.

19. The meter assembly of claim 16, wherein the modular antenna assembly is at a position vertically offset from the meter antenna such that the modular antenna is vertically offset from the meter, and wherein the position of the modular antenna assembly is above the meter such that the modular antenna is above the meter.

20. The meter assembly of claim 16, wherein the collar connector comprises an RF connector.

* * * * *